(12) United States Patent
Mochizuki

(10) Patent No.: US 7,027,206 B2
(45) Date of Patent: Apr. 11, 2006

(54) SPATIAL LIGHT MODULATOR, SPATIAL LIGHT MODULATOR ARRAY, AND IMAGE FORMATION APPARATUS

(75) Inventor: Fumihiko Mochizuki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 11/041,297

(22) Filed: Jan. 25, 2005

(65) Prior Publication Data

US 2005/0195461 A1 Sep. 8, 2005

(30) Foreign Application Priority Data

Jan. 26, 2004 (JP) .................. P. 2004-017071

(51) Int. Cl.
*G02B 26/00* (2006.01)
*G03B 21/28* (2006.01)

(52) U.S. Cl. ............... 359/291; 359/290; 359/295; 353/98; 353/99

(58) Field of Classification Search ......... 359/290, 359/291, 295, 580, 586, 587; 353/98, 99
See application file for complete search history.

(56) References Cited

U.S. PATENT DOCUMENTS

| 6,195,196 | B1 * | 2/2001 | Kimura et al. ............ 359/295 |
| 6,930,816 | B1 * | 8/2005 | Mochizuki ................ 359/291 |
| 2004/0189952 | A1 * | 9/2004 | Kuratomi .................. 353/31 |

FOREIGN PATENT DOCUMENTS

JP 8-334709 A 12/1996

* cited by examiner

*Primary Examiner*—Loha Ben
*Assistant Examiner*—Jack Dinh
(74) *Attorney, Agent, or Firm*—Sughrue Mion, PLLC

(57) ABSTRACT

A spatial light modulator for changing transmittance of incident light from a light source to perform light modulation, the spatial light modulator comprising: a plane substrate transparent for the incident light; a first electrode being provided on the plane substrate; a deformable member being provided above the plane substrate and containing a second electrode placed with a gap above said first electrode, the deformable member deforming in response to an electrostatic force occurring as voltage is applied to said first electrode and the second electrode; and an optical function film being formed on the deformable member, wherein the optical function film has incidence angle dependency that the transmittance of the incident light changes in response to an incidence angle of the incident light on the optical function film, and is inclinable relative to the plane substrate in response to the electrostatic force.

13 Claims, 11 Drawing Sheets

FIG. 2

| MATERIAL | FILM THICKNESS |
|---|---|
| TiO2 | 57.65 |
| SiO2 | 94.5 |
| TiO2 | 57.65 |
| SiO2 | 94.5 |
| TiO2 | 57.65 |
| SiO2 | 94.5 |
| TiO2 | 57.65 |
| SiO2 | 189 |
| TiO2 | 57.65 |
| SiO2 | 94.5 |
| TiO2 | 57.65 |
| SiO2 | 94.5 |
| TiO2 | 57.65 |
| SiO2 | 94.5 |
| TiO2 | 57.65 |

LIGHT

LIGHT

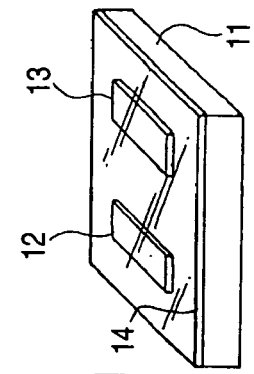
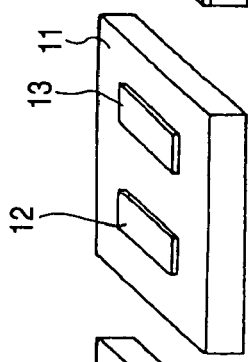
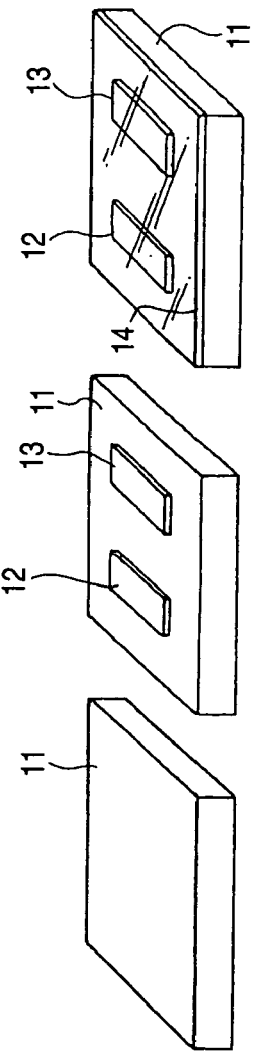
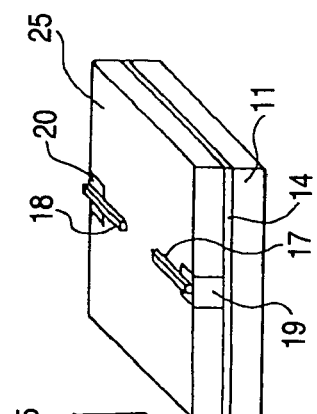
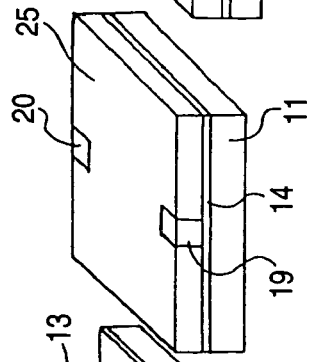
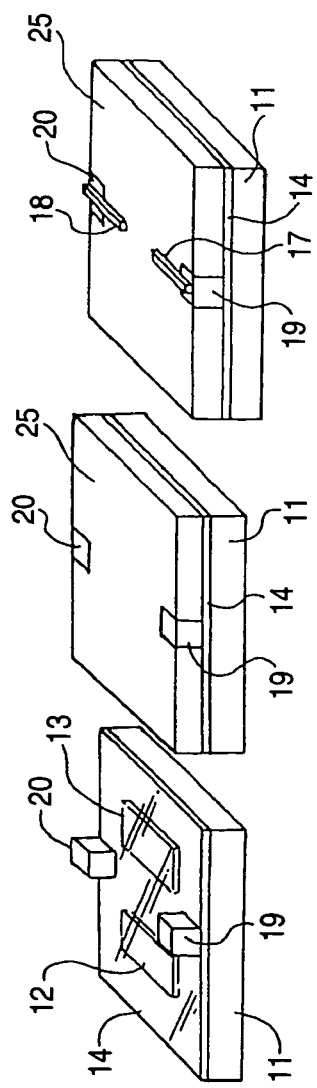
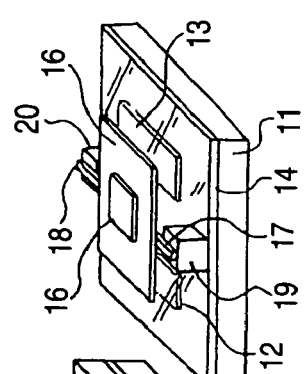
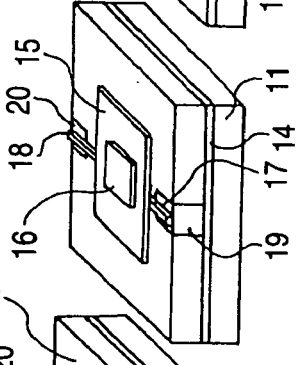
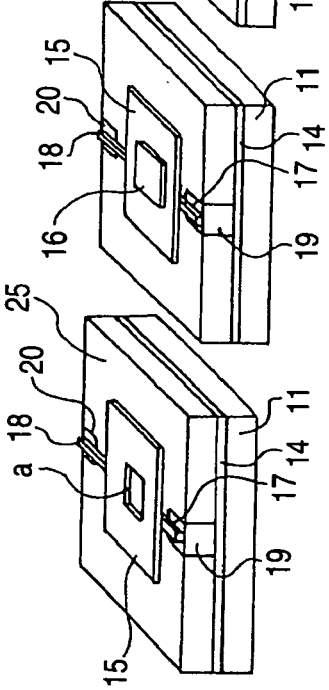
FIG. 7A  FIG. 7B  FIG. 7C
FIG. 7D  FIG. 7E  FIG. 7F
FIG. 7G  FIG. 7H  FIG. 7I

SPATIAL LIGHT MODULATOR, SPATIAL LIGHT MODULATOR ARRAY, AND IMAGE FORMATION APPARATUS

BACKGROUND OF THE INVENTION

1. Field of the Invention

This invention relates to a spatial light modulator for changing the transmittance of incident light from a light source for performing light modulation, a spatial light modulator array having the spatial light modulators put into an array, and an image formation apparatus using the spatial light modulator array.

2. Description of the Related Art

Hitherto, a DMD (Digital Micromirror Device) has been known as a device for forming an image. The DMD is as follows: An integrated circuit is formed on a silicon substrate, as many mirrors each having a minute size as the number of pixels are placed on the integrated circuit, and the reflection amount of light applied to the mirrors from a light source, thereby performing light modulation for forming an image. A document relevant to the DMD is JP-A-8-334709.

The DMD is a device for reflecting light on a mirror, thereby performing light modulation. A reflection spatial light modulator involves a problem of complicating the configuration of a peripheral optical system because incident light and outgoing light are on the same side relative to the spatial light modulator, and is unsuitable for miniaturization. In contrast, a transmission spatial light modulator has the advantage that the configuration of a peripheral optical system becomes simple because incident light and outgoing light are on opposite sides relative to the spatial light modulator.

SUMMARY OF THE INVENTION

It is therefore an object of the invention to provide a miniaturizable transmission spatial light modulator for controlling the transmittance of light for performing light modulation.

According to the invention, there is provided a spatial light modulator for changing transmittance of incident light from a light source to perform light modulation, the spatial light modulator comprising: a plane substrate transparent for the incident light; a first electrode being provided on the plane substrate; a deformable member being provided above the plane substrate and containing a second electrode placed with a gap above said first electrode, the deformable member deforming in response to an electrostatic force occurring as voltage is applied to said first electrode and the second electrode; and an optical function film being formed on the deformable member, wherein the optical function film has incidence angle dependency that the transmittance of the incident light changes in response to an incidence angle of the incident light on the optical function film, and is inclinable relative to the plane substrate in response to the electrostatic force.

According to the configuration, the optical function film is inclined by applying voltage to the first electrode and the second electrode and thus as incident light from the light source is made incident on the optical function film, the incidence angle of the incident light changes in response to the inclination and the transmittance of the incident light changes accordingly. Therefore, a transmission spatial light modulator can be provided in the simple configuration. Since the restrictions on the optical path can be lessened, it is made possible to miniaturize the spatial light modulator.

According to the invention, there is provided the spatial light modulator, wherein the deformable member has a face parallel with the plane substrate in a state in which the electrostatic force does not occur, and the parallel face contains a slope inclined relative to the plane substrate in a state in which the electrostatic force occurs, and wherein the optical function film is formed on the slope.

According to the invention, there is provided the spatial light modulator, wherein the optical function film reflects the incident light in a state in which the optical function film is parallel with the plane substrate and allows the incident light to pass through in a state in which the optical function film is inclined relative to the plane substrate.

According to the configuration, the light reflected on the optical function film can be prevented from becoming stray light and transmission and reflection of light can also be controlled with good accuracy. It is also made possible to degrade the creation accuracy of the spatial light modulator.

According to the invention, there is provided the spatial light modulator, wherein the optical function film is formed at a position on the slope not overlapping the first electrode.

According to the invention, there is provided the spatial light modulator, wherein the deformable member is a planar member, the spatial light modulator further comprising a hinge part that supports the deformable member rotatably in a direction in which the electrostatic force acts.

According to the configuration, the deformable member, which is a planar member, can be rotated in response to the electrostatic force, so that the optical function film can be made inclinable by the rotation operation.

According to the invention, there is provided the spatial light modulator, wherein the deformable member is placed above the first electrode on the plane substrate.

According to the configuration, the second electrode can be attracted to the side of the first electrode by the electrostatic force for deforming the deformable member, so that the optical function film can be made inclinable as the deformable member is deformed.

According to the invention, there is provided the spatial light modulator further comprising a third electrode being opposed to the second electrode and above the second electrode.

According to the configuration, deformation of the deformable member can be controlled using the electrostatic force occurring between the first and second electrodes and the electrostatic force occurring between the second and third electrodes, so that it is made possible to perform light modulation at high speed.

According to the invention, there is provided the spatial light modulator, wherein the optical function film contains a dielectric multilayer.

According to the invention, there is provided the spatial light modulator, wherein the optical function film contains a film using a cholesteric liquid crystal layer.

According to the configuration, the manufacturing cost of the optical function film can be suppressed. Since the cholesteric liquid crystal layer has strong incidence angle dependency, transmission and reflection of light can be controlled simply by changing a little the inclination angle of the optical function film, and the design flexibility of the spatial light modulator can be enhanced.

According to the invention, there is provided a spatial light modulator array comprising a plurality of spatial light modulators in one dimension or in two dimensions on the same plane, each of said plurality of spatial light modulators being the above-described spatial light modulator.

According to the invention, there is provided the spatial light modulator array, wherein the incident light is incident from below the plane substrate, the spatial light modulator array comprising a light collimating unit that collimates the incident light.

According to the invention, there is provided the spatial light modulator array, wherein the incident light is incident from below the plane substrate, and wherein the spatial light modulator array comprises, below the plane substrate, a microlens array having a plurality of microlenses, each of which corresponding to each of said plurality of spatial light modulators.

According to the invention, there is provided an image formation apparatus comprising: the above-described spatial light modulator array; the light source; and a projection optical system that projects light emitted from the spatial light modulator array on an image formation face.

BRIEF DESCRIPTION OF THE DRAWINGS

FIG. 2 is a drawing to show an example of design values of a dielectric multilayer, an optical function film of the spatial light modulator to describe the first embodiment of the invention;

FIG. 7 is a drawing to describe the manufacturing process of the spatial light modulator 10 shown in FIG. 1;

DETAILED DESCRIPTION OF THE INVENTION

Referring now to the accompanying drawings, there are shown preferred embodiments of the invention.

(First Embodiment)

Figure 1:
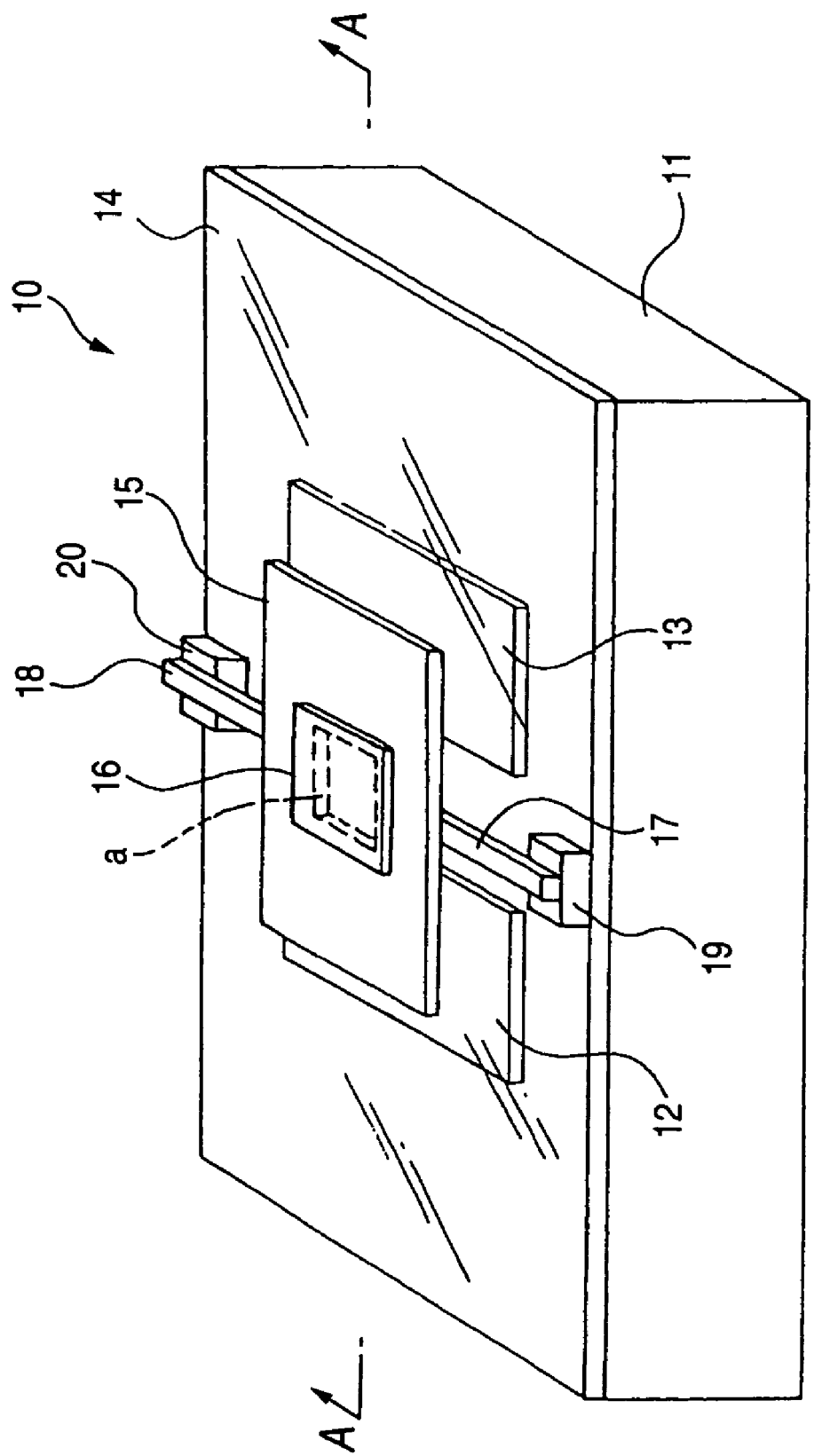
FIG. 1 is a perspective view to show a schematic configuration of a spatial light modulator to describe a first embodiment of the invention.

FIG. 1 is a perspective view to show a schematic configuration of a spatial light modulator to describe a first embodiment of the invention. The spatial light modulator of the embodiment is used with an image formation apparatus of an exposure device, a projector, a display, etc., and is manufactured by MEMS (Micro Electro Mechanical System).

A spatial light modulator 10 includes a plane substrate 11, electrodes 12 and 13 provided on the plane substrate 11, an insulating film 14 formed on the electrodes 12 and 13, an electrode 15 placed above the electrodes 12 and 13 with a given space, an optical function film 16 formed on the surface of the electrode 15, hinge parts 17 and 18 for rotatably supporting the electrode 15, and support parts 19 and 20 for supporting the hinge parts 17 and 18.

The plane substrate 11 is made of a transparent member for incident light from a light source incident from below upward in FIG. 1 and is a glass substrate, etc., for example. The light from the light source passes through the plane substrate 11 and then is incident on the optical function film 16.

The insulating film 14 is a film having insulation properties, such as $SiO_2$ (silicon dioxide)

The support parts 19 and 20 are placed upright on the plane substrate 11 for supporting the hinge parts 17 and 18 respectively.

The electrode 15 is a deformable member whose state changes as the electrode 15 rotates on the hinge parts 17 and 18 in the direction in which the electrostatic force generated by the voltage applied to the electrode 12 or 13 and the electrode 15 acts; the electrode 15 is a planar electrode which becomes parallel with the plane substrate 11 in a state in which voltage is not applied to the electrode 12 or 13 or the electrode 15. An opening a is formed as indicated by the dotted line in FIG. 1 in the area of the electrode 15 covered with the optical function film 16, and light from the light source is incident on the opening a. A voltage is applied to the electrode 15 by a driver (not shown).

The electrodes 12 and 13 are placed in an area not overlapping the optical function film 16 when viewed from above in FIG. 1, and a voltage is applied by a driver (not shown).

The optical function film 16 is a dielectric multilayer, for example. The dielectric multilayer is provided by depositing high-refractive-index material and low-refractive-index material in order. As the optical characteristic, the dielectric multilayer has a function of selectively reflecting incident light according to the wavelength thereof and a feature that the selective reflection wavelength shifts to the short wavelength side in response to an increase in the incidence angle. The dielectric multilayer makes it possible to form a reflecting film for enabling any desired wavelength selection in a large-area and simple configuration, and the incidence angle dependency of the reflection wavelength can be used to easily select an optical path. The optical function film 16 is formed at the position covering the opening a of the electrode 15. In FIG. 1, the optical function film 16 is formed on the opposite face to the face of the electrode 15 on the side of the plane substrate 11, but may be formed at the position covering the opening a on the face of the electrode 15 on the side of the plane substrate 11. The optical function film 16 may be formed not only on the surface of the electrode 15, but also inside the electrode 15. The optical function film 16 can be formed having any desired incidence angle dependency by adjusting the film thickness, the film spacing, etc.

FIG. 2 is a drawing to show an example of design values of the dielectric multilayer, the optical function film 16. The dielectric multilayer is a multilayer film of 15 layers provided by depositing $TiO_2$ (titanium dioxide) and $SiO_2$ alternately and the film thickness of $TiO_2$ is 57.65 nm and that of $SiO_2$ is 94.5 nm.

FIG. 3 is a drawing to show the incidence angle dependency of the dielectric multilayer formed according to the design values shown in FIG. 2.

Figure 3A:
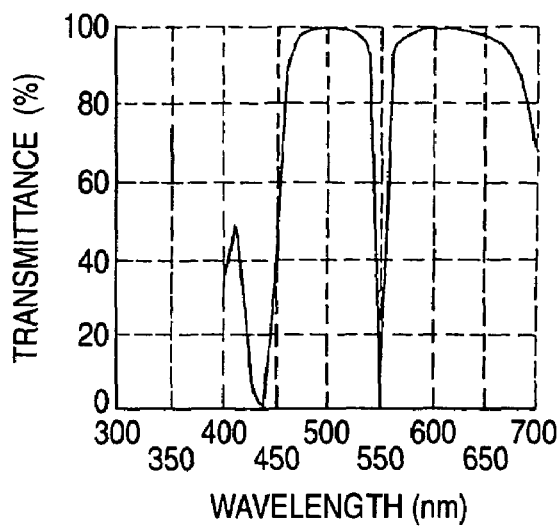
FIG. 3 is a drawing to show the incidence angle dependency of the dielectric multilayer formed according to the design values shown in FIG. 2.
Figure 3B:
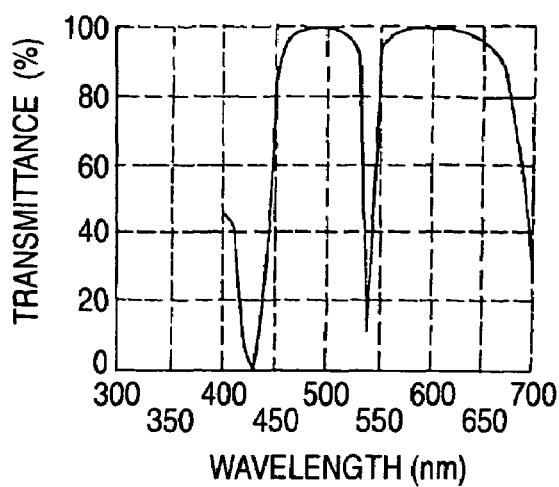
Figure 3C:
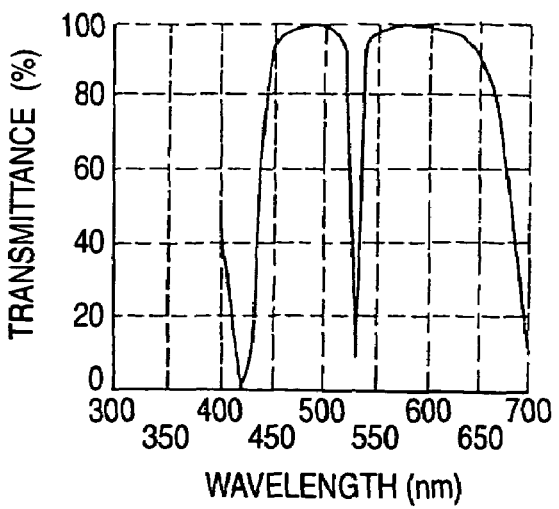

When light having a wavelength of 550 nm is made incident on the dielectric multilayer, if the incidence angle of the light incident on the dielectric multilayer is 0 degrees (if the light is incident on the dielectric multilayer perpendicularly), the light whose wavelength is 550 nm does not pass through and is reflected as shown in FIG. 3A. If the incidence angle of the light incident on the dielectric multilayer is 13 degrees, the light whose wavelength is 550 nm passes through as shown in FIG. 3B. If the incidence angle of the light incident on the dielectric multilayer is 18 degrees, the light whose wavelength is 550 nm passes through more than that when the incidence angle is 13 degrees as shown in FIG. 3C. The dielectric multilayer is provided with such incidence angle dependency, whereby it is made possible to control transmission and reflection of light by changing the incidence angle of the incident light on the dielectric multilayer.

The operation of the spatial light modulator 10 will be discussed with reference to the drawings. In the description to follow, it is assumed that the wavelength of light from the light source is 550 nm, that a dielectric multilayer is used as the optical function film 16, and that the dielectric multilayer is formed based on the design values shown in FIG. 2.

Figure 4A:
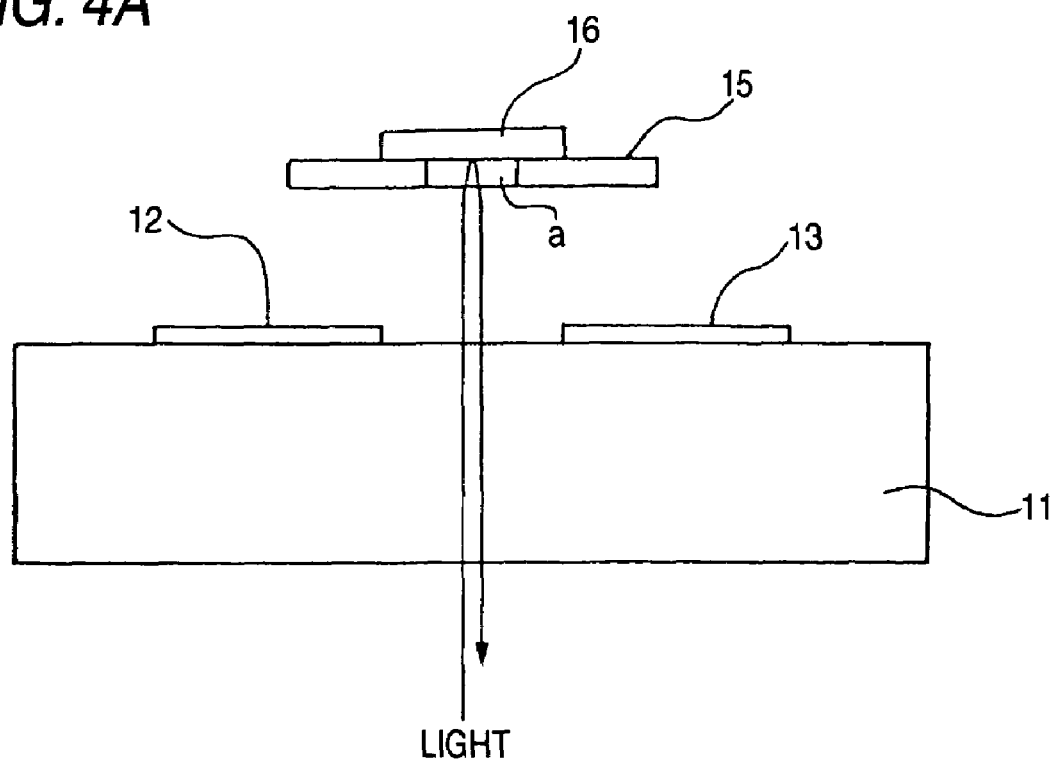
FIG. 4A is a sectional view taken on line A—A in FIG. 1 in a state in which voltage is not applied to electrodes in FIG. 1
Figure 4B:
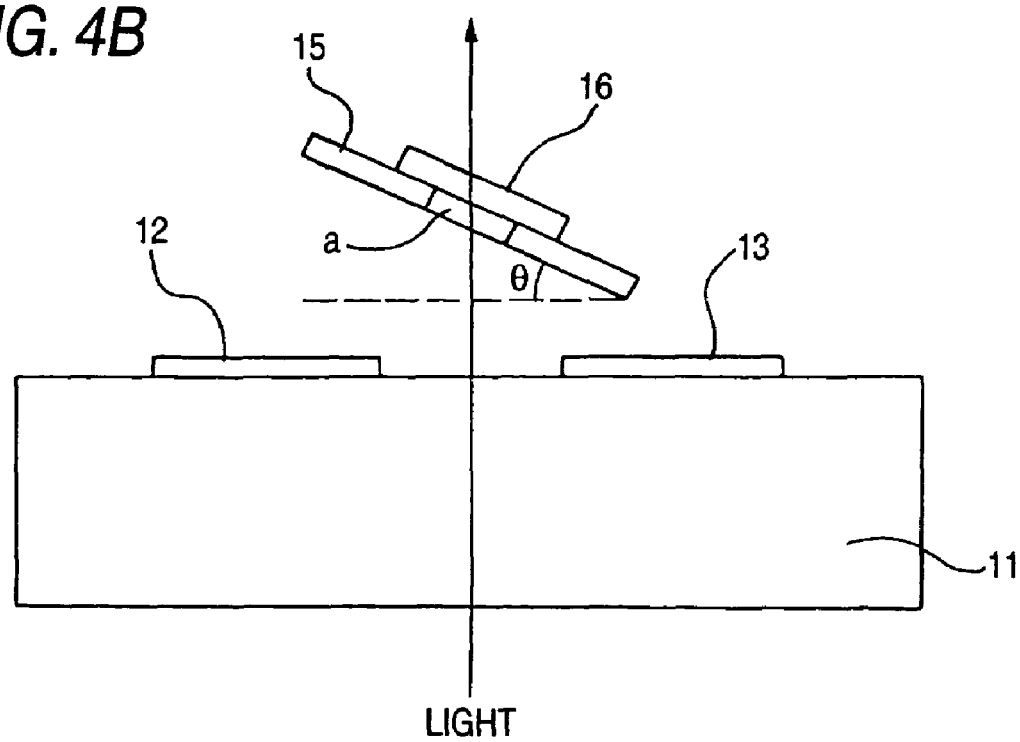
FIG. 4B is a sectional view taken on line A—A in FIG. 1 in a state in which voltage is applied to electrodes in FIG. 1.

FIG. 4A is a sectional view taken on line A—A in FIG. 1 in a state in which voltage is not applied to the electrode 13 or the electrode 15 in FIG. 1. FIG. 4B is a sectional view taken on line A—A in FIG. 1 in a state in which voltage is applied to the electrode 13 and the electrode 15 in FIG. 1.

Since an electrostatic force does not occur between the electrode 13 and the electrode 15 in the state in which voltage is not applied to the electrode 13 or the electrode 15, the electrode 15 becomes parallel to the plane substrate 11, as shown in FIG. 4A. In this state, the incidence angle of the light incident on the optical function film 16 becomes 0 degrees and thus the light from the light source does not pass through and is reflected as shown in FIG. 3A.

Since an electrostatic force occurs between the electrode 13 and the electrode 15 in the state in which voltage is applied to the electrode 13 and the electrode 15, the electrode 15 becomes inclined relative to the plane substrate 11, as shown in FIG. 4B. Assuming that the inclination angle θ is 18 degrees, the incidence angle of the light incident on the optical function film 16 becomes 18 degrees in this state and thus the light from the light source passes through as shown in FIG. 3C.

Thus, the spatial light modulator 10 can perform light modulation by simple operation in such a manner that voltage is applied to the electrode 13 and the electrode 15 for inclining the optical function film 16 relative to the plane substrate 11 for allowing the light to pass through and that voltage is not applied to the electrode 13 or the electrode 15 for making the optical function film 16 parallel to the plane substrate 11 for reflecting the light, so that a transmission spatial light modulator can be realized in the simple configuration.

The spatial light modulator 10 allows the light incident on the optical function film 16 to pass through and the optical function film 16 scarcely absorbs the light with respect to the wavelength of the light from the light source, so that light modulation with high light use efficiency is made possible. To use strong light, it is also possible to minimize heat generation caused by absorbing the light.

The spatial light modulator 10 has the advantage that it can be compatible with light sources for emitting light of various wavelengths simply by changing the incidence angle dependency of the optical function film 16.

The spatial light modulator 10 allows light to be incident on the optical function film 16 from below upward in FIG. 1 and thus involves few restrictions on the optical path and miniaturization of the spatial light modulator 10 is made possible.

A spatial light modulator array having the spatial light modulators 10 arranged in one dimension or in two dimensions on the same plane can be used to miniaturize an image formation apparatus of an exposure device, a projector, a display, etc.

In FIG. 1, the electrodes 12 and 13 are not placed below the optical function film 16; however, if the electrodes 12 and 13 are made transparent electrodes, the electrodes 12 and 13 may be placed below the optical function film 16. If the electrode 15 is made a transparent electrode, the opening a need not necessarily be provided. If the electrodes 12, 13, and 15 are made transparent electrodes, the formation position of the optical function film 16 on the electrode 15 is not limited.

In the description given above, the whole electrode 15 is a deformable member, but electrodes may exist only at the positions opposed to the electrodes 12 and 13 and other portions need not be electrodes.

In the description given above, the optical function film 16 is inclined relative to the plane substrate 11 for allowing the light to pass through and the optical function film 16 is made parallel to the plane substrate 11 for reflecting the light. However, the optical function film 16 may be designed so that the optical function film 16 is inclined relative to the plane substrate 11 for reflecting the light and the optical function film 16 is made parallel to the plane substrate 11 for allowing the light to pass through.

To incline the optical function film 16 relative to the plane substrate 11 for reflecting the light, the reflected light repeats reflection in the plane substrate 11 and becomes stray light. However, to make the optical function film 16 parallel to the plane substrate 11 for reflecting the light, the reflected light returns to the light incidence side as it is, so that stray light can be prevented from occurring. To make the optical function film 16 parallel to the plane substrate 11, the optical function film 16 easily enters an unstable state. Thus, if an attempt is made to allow light to pass through in this state, the possibility that precise light transmission control may be unable to be performed occurs. However, to incline the optical function film 16 relative to the plane substrate 11 for allowing the light to pass through, the electrode 12 or 13 and the electrode 15 enable the inclination angle of the optical function film 16 to be controlled with good accuracy, so that it is made possible to perform precise light transmission control.

In the description given above, the optical function film 16 is inclined relative to the plane substrate 11 for allowing the light to pass through and the optical function film 16 is made parallel to the plane substrate 11 for reflecting the light. However, the inclination angle of the optical function film 16 to allow light to pass through or reflect light can be set to any desired angle. For example, the following configuration may be adopted: The optical function film 16 is inclined 10 degrees relative to the plane substrate 11 in a state in which an electrostatic force does not occur and the optical function film 16 is inclined further 10 degrees relative to the plane substrate 11 in a state in which an electrostatic force occurs. In this case, whether light is allowed to pass through or is reflected depending on the inclination degree may be determined by changing the characteristic of the optical function film 16. In the configuration in which the optical function film 16 is inclined relative to the plane substrate 11 for allowing the light to pass through and the optical function film 16 is made parallel to the plane substrate 11 for reflecting the light as in the embodiment, it is not necessary to enhance the manufacturing accuracy of the spatial light modulator 10, thus leading to a reduction in the manufacturing cost.

The spatial light modulator 10 of the embodiment can use not only a dielectric multilayer, but also a substance using a cholesteric liquid crystal layer, for example, as the optical function film 16.

Figure 5:
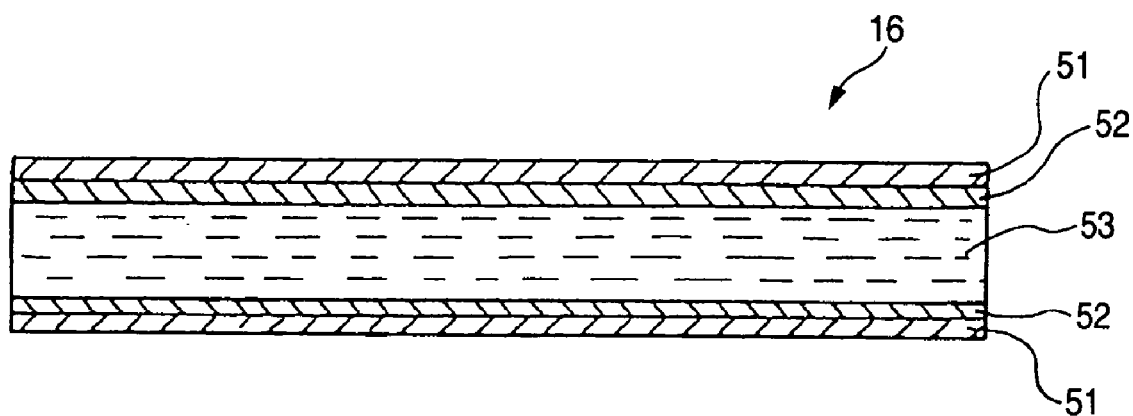
FIG. 5 is a drawing to show a schematic composition of a substance using a cholesteric liquid crystal layer as the optical function film.
Figure 6A:
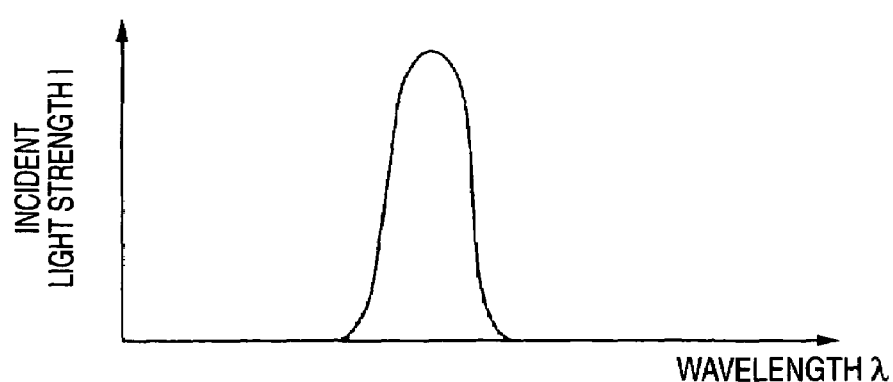
FIG. 6 is a drawing to show the incidence angle dependency of the optical function film shown in FIG. 5.
Figure 6B:
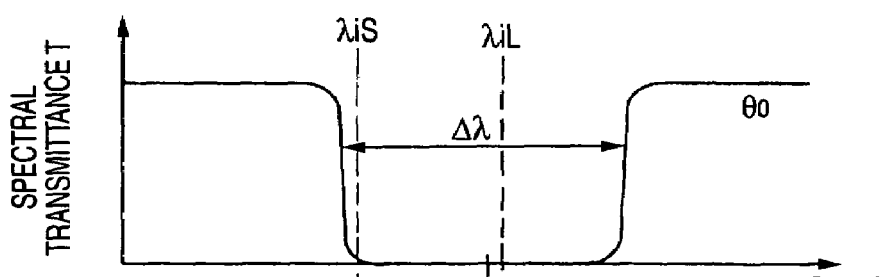
Figure 6C:
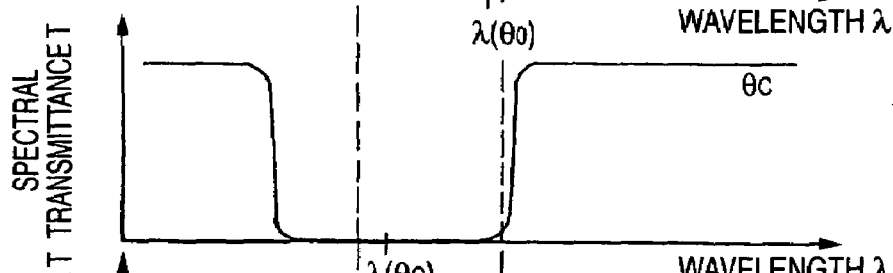
Figure 6D:
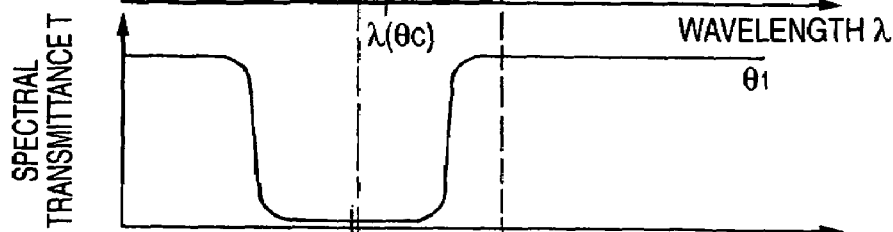
Figure 6E:
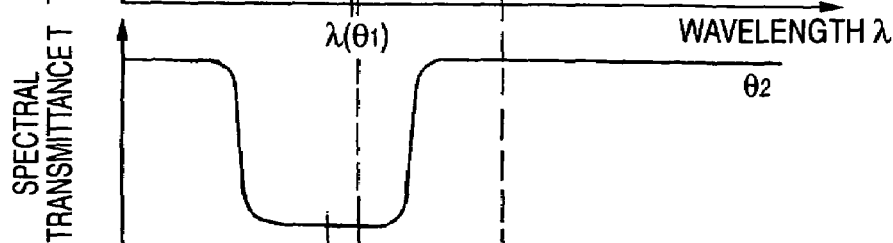
Figure 6F:
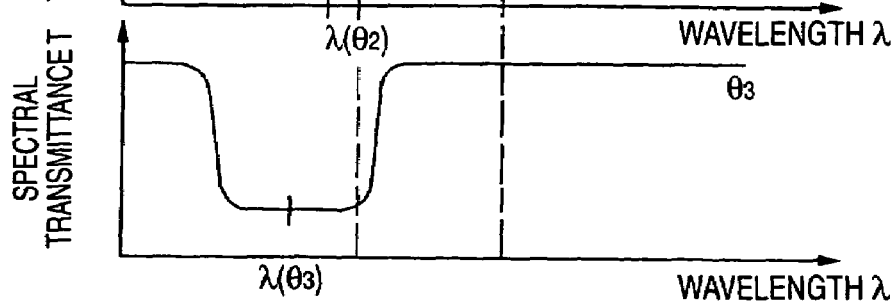

FIG. 5 is a sectional view of a schematic composition of a substance using a cholesteric liquid crystal layer as the optical function film 16.

In this case, the optical function film 16 is made up of a pair of transparent electrodes 51 made of ITO, etc., orientation layers 52 formed inside the transparent electrodes 51, and a cholesteric liquid crystal layer 53 sandwiched between the orientation layers 52.

The filtering effect produced by the cholesteric liquid crystal layer 53 of the composition will be discussed below: The cholesteric liquid crystal layer 53 has cholesteric liquid crystal molecules oriented in parallel with the layer and showing a helical structure in a perpendicular direction to the layer.

Letting the ordinary index of the cholesteric liquid crystal layer 53 be no, the extraordinary index be ne, the complex refractive index be $\Delta n$, and the average refractive index be n, the complex refractive index $\Delta n$ is represented by expression (1):

$$\Delta n = ne - no \quad (1)$$

The average refractive index n is approximately represented by expression (2):

$$n = (ne + no)/2 \quad (2)$$

Further, letting the helical pitch of the cholesteric liquid crystal layer 53 be P [nm], the cholesteric liquid crystal layer 53 shows a selectively reflecting characteristic on the principle of Bragg reflection. That is, the center wavelength of incident light when light incident on the cholesteric liquid crystal layer 53 at incidence angle $\theta$ (deg) is selectively reflected, $\lambda(\theta)$ [nm], is represented by expression (3):

$$\lambda(\theta) = \lambda(0) \cdot \cos[\sin^{-1}(\sin \theta/n)] \quad (3)$$

However, it is assumed that the incident light is made incident from air (refractive index=1). Here, $\lambda(0)$ [nm] is the center wavelength when the incidence angle is $\theta_0$, namely, light is perpendicularly incident on the layer, and is represented by expression (4):

$$\lambda(0) = n \cdot P \quad (4)$$

Reflection wavelength width $\Delta\lambda$ [nm] is represented by expression (5):

$$\Delta\lambda = \Delta n \cdot P \quad (5)$$

Therefore, the ordinary index no, the extraordinary index ne, and the helical pitch P of the physical property values of the cholesteric liquid crystal layer 53 are controlled to form the layer, whereby an optical filter having any desired reflection center wavelength $\lambda(\theta)$ changing in response to the incidence angle $\theta$ and any desired reflection wavelength width $\Delta\lambda$ can be formed. For example, the helical pitch P can be adjusted by mixing two or more types of materials different in helical pitch and make adjustment, etc.

Further, if the wave range of the target incident light is wide, it is also necessary to widen the selection reflection wave range of the cholesteric liquid crystal layer. In this case, the reflection wave range can be widened by orienting liquid crystal so that the helical pitches differ continuously in the thickness direction. The reflection wave range canal so be widened by depositing cholesteric liquid crystal layers having different selection reflection wave ranges, and the multilayer can be used as the optical function film of the invention.

The cholesteric liquid crystal layer 53 can be manufactured as follows:

A polyimide orientation film is applied onto a support for forming a film of cholesteric liquid crystal, is dried, and is subjected to surface treatment of rubbing. Accordingly, a polyimide orientation film is formed. Preparation liquid provided by mixing a mixture of low-molecular cholesteric liquid crystal or nematic liquid crystal and a chiral agent for forming twist, high-molecular monomer, and a photopolymerization initiator with an organic solvent is applied onto the polyimide orientation film and then is oriented at a proper temperature. Then, the necessary portion is exposed to ultraviolet light for photopolymerization, and unnecessary portions are removed by developing. Last, high-temperature baking is performed for stabilization.

To control the twist direction and the reflection incidence angle, the cholesteric liquid crystal, the chiral agent, and the concentrations thereof may be changed appropriately.

High-molecular cholesteric liquid crystal can also be used to form a film. In this case, preparation liquid provided by mixing high-molecular cholesteric liquid crystal and a photopolymerization initiator with an organic solvent is applied onto a polyimide orientation film and then is oriented at a proper temperature and the necessary portion is exposed to ultraviolet light for photopolymerization in a similar manner to that described above. The reflection incidence angle can be controlled by appropriately selecting the orienting temperature, and photopolymerization is performed for stabilization.

The spectral transmittance of the optical function film 16 of the composition is shown in FIG. 6. The cholesteric liquid crystal layer 53 is an example of putting a left twisted cholesteric liquid crystal layer and a right twisted liquid crystal layer, and reflects all polarization component in the reflection wave range. When the incidence angle is $\theta 0$ equal to or less than total reflection critical angle $\theta c$, the spectral transmittance becomes roughly 0% in wave range of incident light, $\lambda$is to $\lambda$il and a light shield state is entered. As the incidence angle grows like $\theta 1$, $\theta 2$, $\theta 3$ of larger angle than the total reflection critical angle $\theta c$, the transmission characteristic of the spectral transmittance shifts to the short wavelength side and thus the transmission light amount increases. Accordingly, light with the incidence angle component of incident light being $\theta 0$ does not pass through and light with the incidence angle component being θ1, θ2, and θ3 larger than a specific angle passes through more in this order. Using this characteristic, transmission and reflection of light can be controlled in response to the incidence angle of the light.

According to the composition, similar advantages to those when the dielectric multilayer described above is used can be provided and the optical function film 16 can be provided at a lower cost. The cholesteric liquid crystal layer has stronger incidence angle dependency than the dielectric multilayer. Thus, to use the cholesteric liquid crystal layer as the optical function film 16, transmission and reflection of light can be controlled simply by changing a little the inclination angle of the optical function film 16. Therefore, the design flexibility of the spatial light modulator 10 can be enhanced.

In addition to the cholesteric liquid crystal described above, a volume hologram is effective as an optical function film having the function of Bragg reflection. The volume hologram has the Bragg reflection function according to a lattice-like refractive index distribution formed in a film and reflects a specific wavelength. As the incidence angle grows, the reflection wavelength shifts to the short wave side and the volume hologram functions as an optical path selection film. The volume hologram can be formed by using a hologram photograph photosensitive material, a phase separation polymer, HPDLC (holographic polymer dispersed liquid crystal), a photolithography material, etc., as a photosensitive material and performing multiple-beam interference exposure for the material.

To use the substance shown in FIG. 5 as the optical function film 16, an insulting film may be formed on the electrode 15 in FIG. 1 and the optical function film 16 may be formed on the insulting film so that voltage can be applied to the transparent electrodes 51 by a driver (not shown).

(Manufacturing Process)

The manufacturing process of the spatial light modulator 10 shown in FIG. 1 will be discussed with reference to the drawing.

FIG. 7 is a drawing to describe the manufacturing process of the spatial light modulator 10 shown in FIG. 1. The spatial light modulator 10 is manufactured according to the following steps (a) to (i). (a) to (i) in FIG. 7 correspond to the steps (a) to (i) and show each the state after treatment.

Step (a): A glass substrate 11 is subjected to alkali cleaning and is dried.

Step (b): A film of aluminum is formed on the dried glass substrate 11 by evaporation, sputtering, etc., electrodes 12 and 13 are patterned by photolithography, and wet or dry etching, etc., is performed for removing excessive aluminum.

Step (c): A film of $SiO_2$ is formed on the glass substrate 11 by sputtering, CVD, etc., to form an insulating layer 14. Here, since an insulating layer may be able to be formed, SiN (silicon nitride) may be used instead of $SiO_2$.

Step (d): A film of aluminum is formed on the insulating layer 14 by evaporation, sputtering, etc., support parts 19 and 20 are patterned by photolithography, and dry etching with chlorine is performed for removing excessive aluminum. Here, the support parts 19 and 20 are conductors, but a film of gold rather than aluminum may be formed, the support parts 19 and 20 may be patterned by photolithography, gold may be removed, and the support parts 19 and 20 may be plated with nickel. Since the support parts 19 and 20 may function as support parts, material is not limited.

Step (e): A film of polyimide is formed on the insulating layer 14 by spin collating and is baked for stabilization, and a sacrifice layer 25 is formed. Further, the surface of the sacrifice layer 25 is ground by CMP (Chemical Mechanical Planarization) to the surfaces of the support parts 19 and 20.

Step (f): A film of aluminum is formed on the sacrifice layer 25 by sputtering, etc., hinge parts 17 and 18 are patterned by photolithography, and dry etching with chlorine is performed for removing excessive aluminum.

Step (g): A film of aluminum is formed on the hinge parts 17 and 18 by sputtering, etc., an electrode 15 is patterned by photolithography, and dry etching with chlorine is performed for removing excessive aluminum. The electrode 15 may be metal having conductivity other than aluminum. An insulating layer and metal may be deposited to form the electrode 15. A transparent conductive film may be used instead of metal.

Step (h): $TiO_2$ and $SiO_2$ are deposited in order on the electrode 15 by sputtering, etc., to form a dielectric multilayer, dielectric multilayer is patterned by photolithography, and dry etching with $CF_4$ (tetrafluoromethane) is performed for removing excessive dielectric multilayer.

Step (i): Dry etching with oxygen is performed for removing the sacrifice layer 25.

(Second Embodiment)

Figure 8:
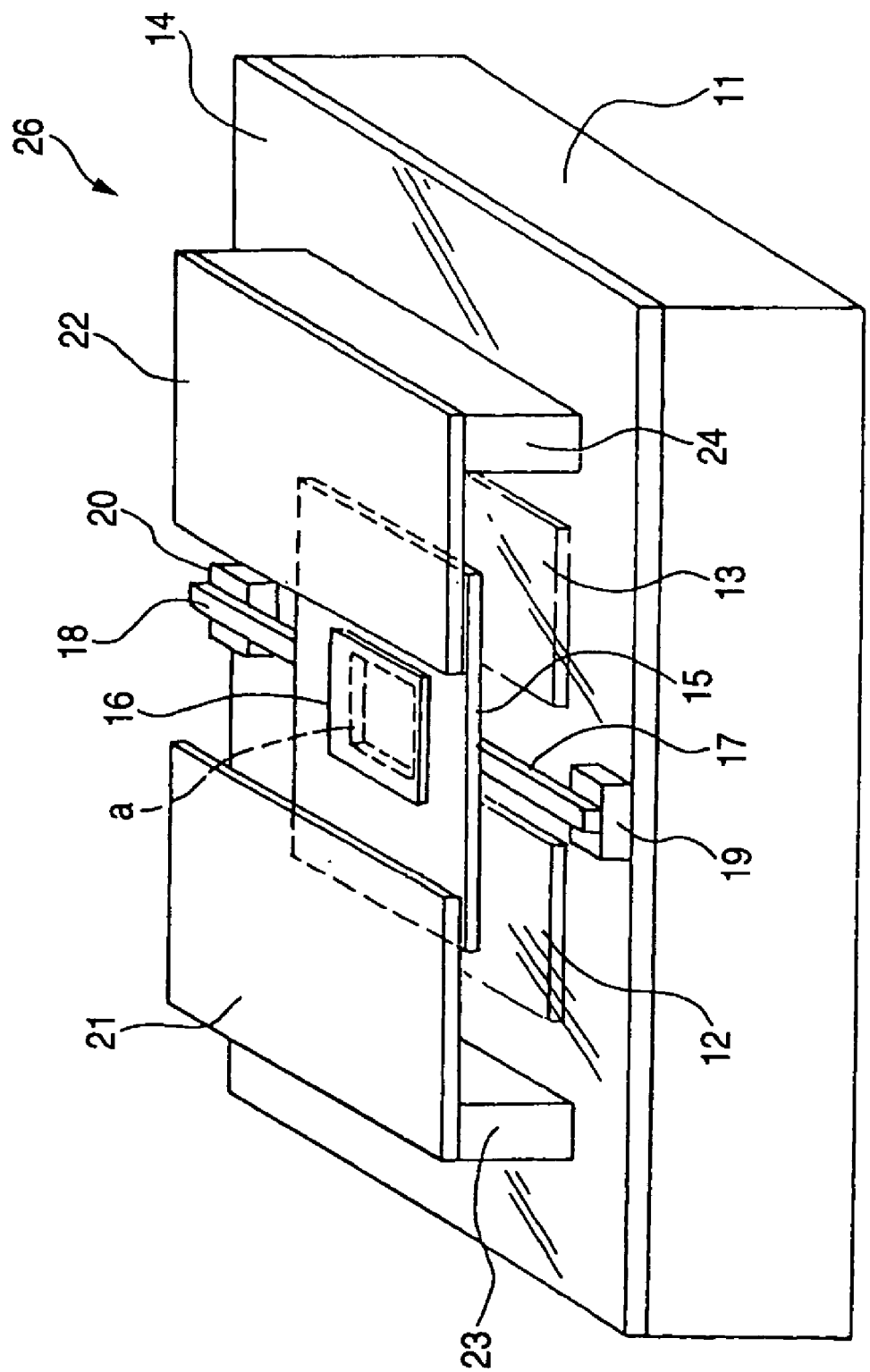
FIG. 8 is a perspective view to show a schematic configuration of a spatial light modulator to describe a second embodiment of the invention.

FIG. 8 is a perspective view to show a schematic configuration of a spatial light modulator to describe a second embodiment of the invention. Components similar to those previously described with reference to FIG. 1 are denoted by the same reference numerals in FIG. 8 and will not be discussed again.

A spatial light modulator 26 includes a plane substrate 11, electrodes 12 and 13 provided on the plane substrate 11, an insulating film 14 formed on the electrodes 12 and 13, an electrode 15 placed above the electrodes 12 and 13 with a given space, an optical function film 16 formed on the surface of the electrode 15, hinge parts 17 and 18 for rotatably supporting the electrode 15, support parts 19 and 20 for supporting the hinge parts 17 and 18, electrodes 21 and 22, and support parts 23 and 24 for supporting the electrodes 21 and 22.

The support parts 23 and 24 are placed upright on the plane substrate 11 for supporting the electrodes 21 and 22 respectively.

The electrodes 21 and 22 are opposed to the electrode 15 with a gap above the electrode 15, and voltage is applied by a driver (not shown). From a state in which the electrode 15 is inclined, voltage application to the electrode 13 is stopped and voltage is applied to the electrode 22, whereby the electrode 15 can be returned to a position parallel with the plane substrate 11 at high speed by the electrostatic force between the electrode 15 and the electrode 22.

The operation of the spatial light modulator 26 in FIG. 8 is as follows:

To allow light from a light source to pass through, voltage is applied to the electrode 13 and the electrode 15 for inclining the optical function film 16 by the electrostatic force between the electrode 13 and the electrode 15. Then, to reflect the light from the light source, voltage application to the electrode 13 is stopped and voltage is applied to the electrode 22 for making the optical function film 16 parallel with the plane substrate 11 by the electrostatic force between the electrode 15 and the electrode 22. In doing so, the spatial light modulator 20 enables switching between transmission and reflection of light at higher speed than the spatial light modulator 10 of the first embodiment.

(Third Embodiment)

Figure 9:
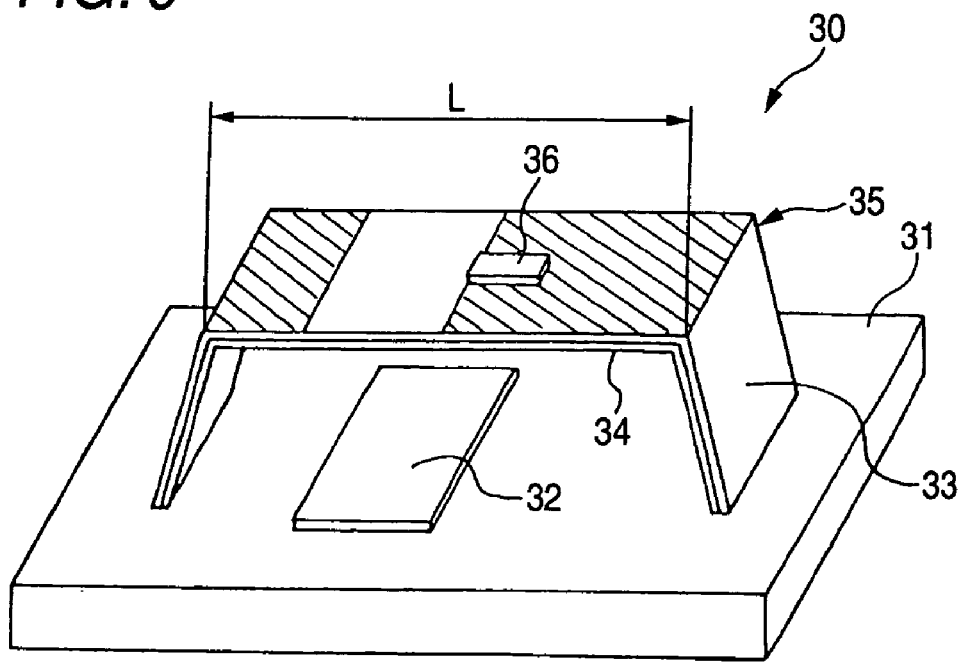
FIG. 9 is a perspective view to show a schematic configuration of a spatial light modulator to describe a third embodiment of the invention.

FIG. 9 is a perspective view to show a schematic configuration of a spatial light modulator to describe a third embodiment of the invention. The spatial light modulator of the embodiment is used with an image formation apparatus of an exposure device, a projector, a display, etc., and is manufactured by MEMS (Micro Electro Mechanical System).

A spatial light modulator 30 includes a plane substrate 31, a transparent electrode 32 provided on the plane substrate 31, a deformable member 35 having a thin film beam 34 placed above the transparent electrode 32 and a transparent electrode 33 formed covering the full surface of the thin film beam 34, and an optical function film 36.

The plane substrate 31 is made of a transparent member for incident light from a light source incident from below upward in FIG. 9 and is a glass substrate, etc., for example. The light from the light source passes through the plane substrate 31 and then passes through the thin film beam 34 and the transparent electrode 33 and is incident on the optical function film 36.

The deformable member 35 is a member whose state changes as it bends in the direction in which the electrostatic force generated by the voltage applied to the transparent electrodes 32 and 33 acts. The deformable member 35 has a top parallel with the plane substrate 31 in a state in which voltage is not applied to the transparent electrode 32 or 33. The top of the deformable member 35 has slopes (indicated as hatched faces in FIG. 9) inclined relative to the plane substrate 31 in a state in which voltage is applied to the transparent electrodes 32 and 33. Length L of the top of the deformable member 35 may be a length to such an extent that slopes can be provided.

The optical function film 36 is a dielectric multilayer, for example. The dielectric multilayer is provided by depositing high-refractive-index material and low-refractive-index material in order. As the optical characteristic, the dielectric multilayer has a function of selectively reflecting incident light according to the wavelength thereof and a feature that the selective reflection wavelength shifts to the short wavelength side in response to the incidence angle. The dielectric multilayer makes it possible to form a reflecting film for enabling any desired wavelength selection in a large-area and simple configuration, and the incidence angle dependency of the reflection wavelength can be used to easily select an optical path. The optical function film 36 is formed on the slope of the top of the deformable member 35. In FIG. 9, the optical function film 36 is formed on the transparent electrode 33. The optical function film 36 has the same incidence angle dependency as the optical function film 16 described in the first embodiment.

The transparent electrode 33 is provided by forming a transparent conductive film on the opposed face of the thin film beam 34 to the transparent electrode 32 or the back. Voltage is applied to the transparent electrode 33 by a driver (not shown).

The transparent electrode 32 is provided by forming a transparent conductive film on the plane substrate 31, and voltage is applied to the transparent electrode 32 by a driver (not shown).

The operation of the spatial light modulator 30 will be discussed with reference to FIGS. 9 and 10.

Figure 10:
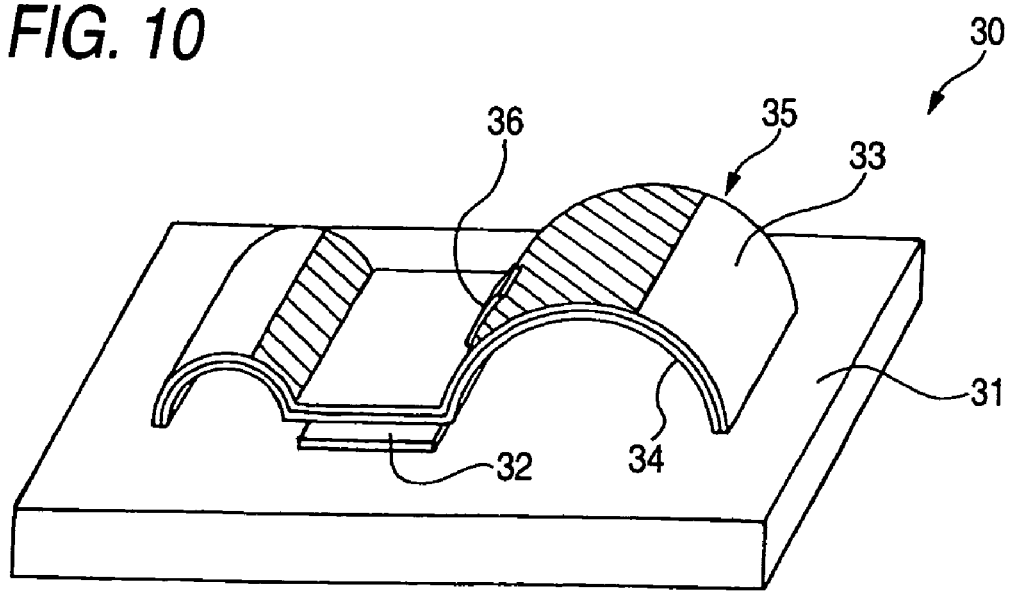
FIG. 10 is a drawing to show a state in which voltage is applied to transparent electrodes of the spatial light modulator in FIG. 9.

FIG. 10 is a drawing to show a state in which voltage is applied to the transparent electrodes 32 and 33 of the spatial light modulator 30 in FIG. 9.

Since an electrostatic force does not occur between the transparent electrodes 32 and 33 in the state in which voltage is not applied to the transparent electrode 32 or 33, the top of the deformable member 35 becomes parallel to the plane substrate 31 and the optical function film 36 also becomes parallel to the plane substrate 31 accordingly, as shown in FIG. 9. In this state, the incidence angle of the light on the optical function film 36 becomes 0 degrees and thus the light does not pass through and is reflected as shown in FIG. 3A.

Since an electrostatic force occurs between the transparent electrodes 32 and 33 in the state in which voltage is applied to the transparent electrodes 32 and 33, the slopes of the top of the deformable member 35 become inclined relative to the plane substrate 31 and the optical function film 36 also becomes inclined relative to the plane substrate 31 accordingly, as shown in FIG. 10. Assuming that the inclination angle is 18 degrees, the incidence angle of the light incident on the optical function film 36 becomes 18 degrees in this state and thus the light from the light source passes through as shown in FIG. 3C.

Thus, the spatial light modulator 30 can perform light modulation by simple operation in such a manner that voltage is applied to the transparent electrodes 32 and 33 for inclining the optical function film 36 relative to the plane substrate 31 for allowing the light to pass through and that voltage is not applied to the transparent electrode 32 or 33 for making the optical function film 36 parallel to the plane substrate 31 for reflecting the light, so that a transmission spatial light modulator can be realized in the simple configuration.

The spatial light modulator 30 allows the light incident on the optical function film 36 to pass through and the optical function film 36 scarcely absorbs the light with respect to the wavelength of the light from the light source, so that light modulation with high light use efficiency is made possible.

The spatial light modulator 30 has the advantage that it can be compatible with light sources for emitting light of various wavelengths simply by changing the incidence angle dependency of the optical function film 36.

The spatial light modulator 30 allows light to be incident on the optical function film 36 from below upward in FIGS. 9 and 10 and thus involves few restrictions on the optical path and miniaturization of the spatial light modulator 30 is made possible.

A spatial light modulator array having the spatial light modulators 30 arranged in one dimension or in two dimensions on the same plane can be used to miniaturize an image formation apparatus of an exposure device, a projector, a display, etc.

If an opening is made in the transparent electrode 33 and the thin film beam 34 in the portion covered with the optical function film 36 and the transparent electrode 32 is placed so as not to overlap the optical function film 36 when viewed from above in FIG. 9, the transparent electrodes 32 and 33 need not be transparent.

In the description given above, the transparent electrode 33 is formed covering the full surface of the thin film beam 34, but is sufficient if the deformable member 35 can be bent. Thus, the transparent electrode 33 may be provided only in the portion where the thin film beam 34 and the transparent electrode 32 cross each other when viewed from above in FIG. 9. In this case, the optical function film 36 is formed on the thin film beam 34.

In the description given above, the optical function film 36 is inclined relative to the plane substrate 31 for allowing the light to pass through and the optical function film 36 is made parallel to the plane substrate 31 for reflecting the light. However, the optical function film 36 may be designed so that the optical function film 36 is inclined relative to the plane substrate 31 for reflecting the light and the optical function film 36 is made parallel to the plane substrate 31 for allowing the light to pass through.

To incline the optical function film 36 relative to the plane substrate 31 for reflecting the light, the reflected light repeats reflection in the plane substrate 31 and becomes stray light. However, to make the optical function film 36 parallel to the plane substrate 31 for reflecting the light, the reflected light returns to the light incidence side as it is, so that stray light can be prevented from occurring. To make the optical function film 36 parallel to the plane substrate 31, the optical function film 36 easily enters an unstable state. Thus, if an attempt is made to allow light to pass through in this state, the possibility that precise light transmission control may be unable to be performed occurs. However, to incline the optical function film 36 relative to the plane substrate 31 for allowing the light to pass through, the transparent electrodes 32 and 33 enable the inclination angle of the optical function film 36 to be controlled with good accuracy, so that it is made possible to perform precise light transmission control.

In the description given above, the optical function film 36 is inclined relative to the plane substrate 31 for allowing the light to pass through and the optical function film 36 is made parallel to the plane substrate 31 for reflecting the light. However, the inclination angle of the optical function film 36 to allow light to pass through or reflect light can be set to any desired angle. For example, the following configuration may be adopted: The optical function film 36 is inclined 10 degrees relative to the plane substrate 31 in a state in which an electrostatic force does not occur and the optical function film 36 is inclined further 10 degrees relative to the plane substrate 31 in a state in which an electrostatic force occurs. In this case, whether light is allowed to pass through or is reflected depending on the inclination degree may be determined by changing the characteristic of the optical function film 36.

In the configuration in which the optical function film 36 is inclined relative to the plane substrate 31 for allowing the light to pass through and the optical function film 36 is made parallel to the plane substrate 31 for reflecting the light as in the embodiment, it is not necessary to enhance the manufacturing accuracy of the spatial light modulator 30, thus leading to a reduction in the manufacturing cost.

Not only a dielectric multilayer, but also the substance shown in FIG. 5 can be used as the optical function film 36.

In addition to the cholesteric liquid crystal described above, a volume hologram may be used as the optical function film 36. The volume hologram has a Bragg reflection function according to a lattice-like refractive index distribution formed in a film and reflects a specific wavelength. As the incidence angle grows, the reflection wavelength shifts to the short wave side and the volume hologram functions as an optical path selection film. The volume hologram can be formed by using a hologram photograph photosensitive material, a phase separation polymer, HPDLC (holographic polymer dispersed liquid crystal), a photolithography material, etc., as a photosensitive material and performing multiple-beam interference exposure for the material.

(Fourth Embodiment)

Figure 11:
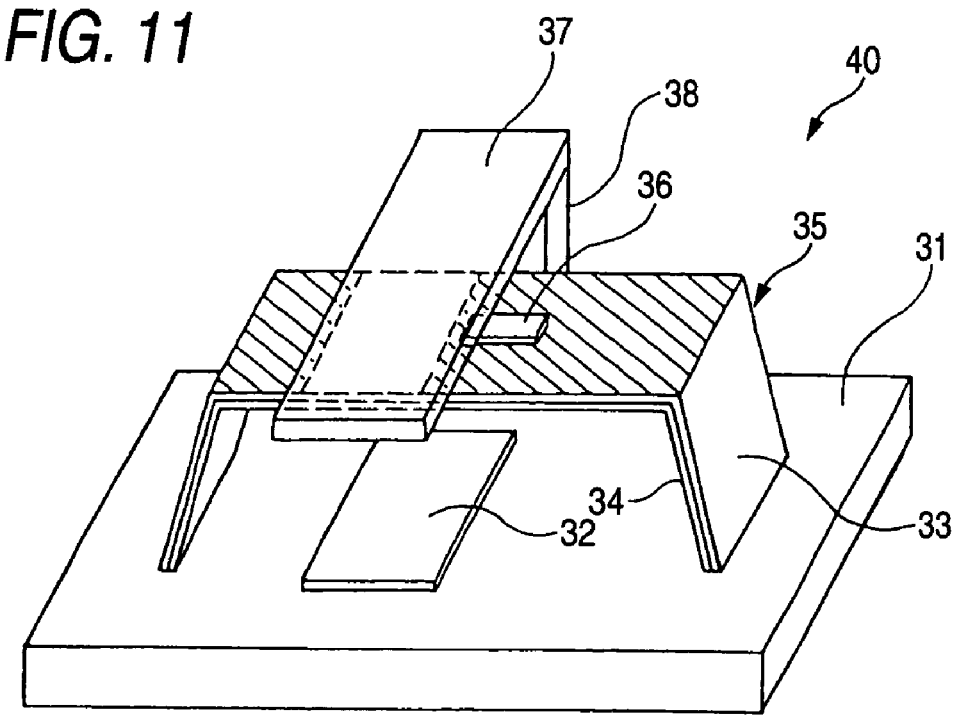
FIG. 11 is a perspective view to show a schematic configuration of a spatial light modulator to describe a fourth embodiment of the invention.

FIG. 11 is a perspective view to show a schematic configuration of a spatial light modulator to describe a fourth embodiment of the invention. Components similar to those previously described with reference to FIG. 9 are denoted by the same reference numerals in FIG. 11 and will not be discussed again.

A spatial light modulator 40 includes a plane substrate 31, a transparent electrode 32 provided on the plane substrate 31, a deformable member 35 having a thin film beam 34 placed above the transparent electrode 32 and a transparent electrode 33 formed on the surface of the thin film beam 34, an optical function film 36, an electrode 37, and a support part 38 for supporting the electrode 37.

The support part 38 is placed upright on the plane substrate 31 for supporting the electrode 37.

The electrode 37 is opposed to the transparent electrode 33 with a gap above the transparent electrode 33, and voltage is applied by a driver (not shown). From a state in which the optical function film 36 is inclined, voltage application to the transparent electrode 32 is stopped and voltage is applied to the electrode 37, whereby the optical function film 36 can be returned to a position parallel with the plane substrate 31 at high speed by the electrostatic force between the transparent electrode 33 and the electrode 37.

The operation of the spatial light modulator 40 in FIG. 11 is as follows:

To allow light from a light source to pass through, voltage is applied to the transparent electrodes 32 and 33 for inclining the optical function film 36 by the electrostatic force between the transparent electrodes 32 and 33. Then, to reflect the light from the light source, voltage application to the transparent electrode 32 is stopped and voltage is applied to the electrode 37 for making the optical function film 36 parallel with the plane substrate 31 by the electrostatic force between the transparent electrode 33 and the electrode 37. In doing so, the spatial light modulator 40 enables switching between transmission and reflection of light at higher speed than the spatial light modulator 10 of the third embodiment.

(Fifth Embodiment)

Figure 12:
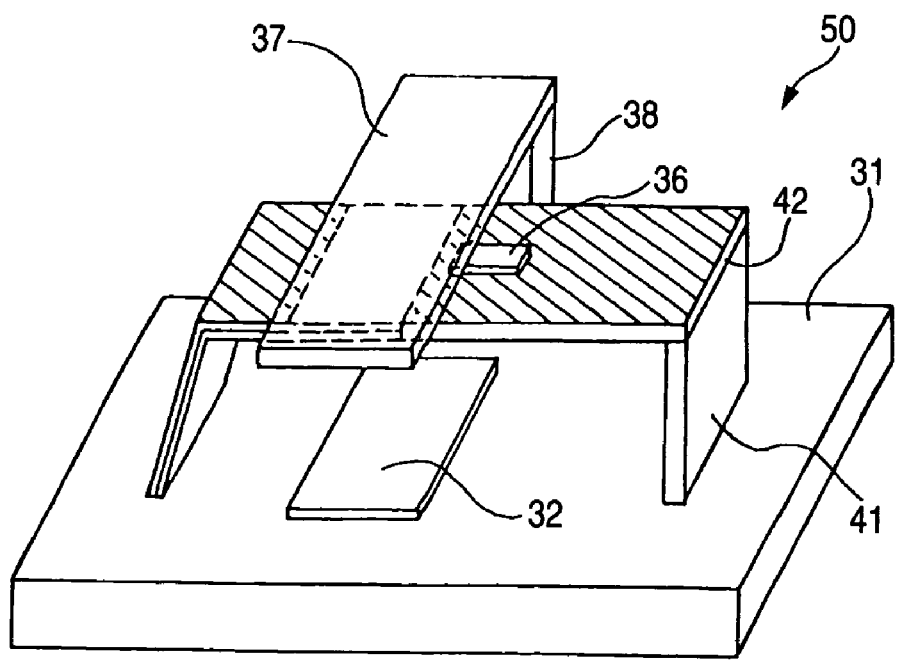
FIG. 12 is a perspective view to show a schematic configuration of a spatial light modulator to describe a fifth embodiment of the invention.

FIG. 12 is a perspective view to show a schematic configuration of a spatial light modulator to describe a fifth embodiment of the invention. Components similar to those previously described with reference to FIG. 11 are denoted by the same reference numerals in FIG. 12 and will not be discussed again.

A spatial light modulator 50 in FIG. 12 is provided by replacing one of the legs of the deformable member 35 of the spatial light modulator 40 with a support part 41 placed upright on a plane substrate 31 and replacing the slope portion where the optical function film 36 is formed with a soft cushion film 42 of an organic film, etc. Thus, the slope portion where the optical function film 36 is formed is the cushion film 42, whereby when voltage is applied to transparent electrodes 32 and 33, a deformable member 35 can be easily bent.

(Sixth Embodiment)

In a sixth embodiment of the invention, an image formation apparatus using a spatial light modulator array having the spatial light modulators described in the first to fifth embodiments arranged in two dimensions on the same plane will be discussed. An exposure device will be discussed as an example of the image formation apparatus.

Figure 13:
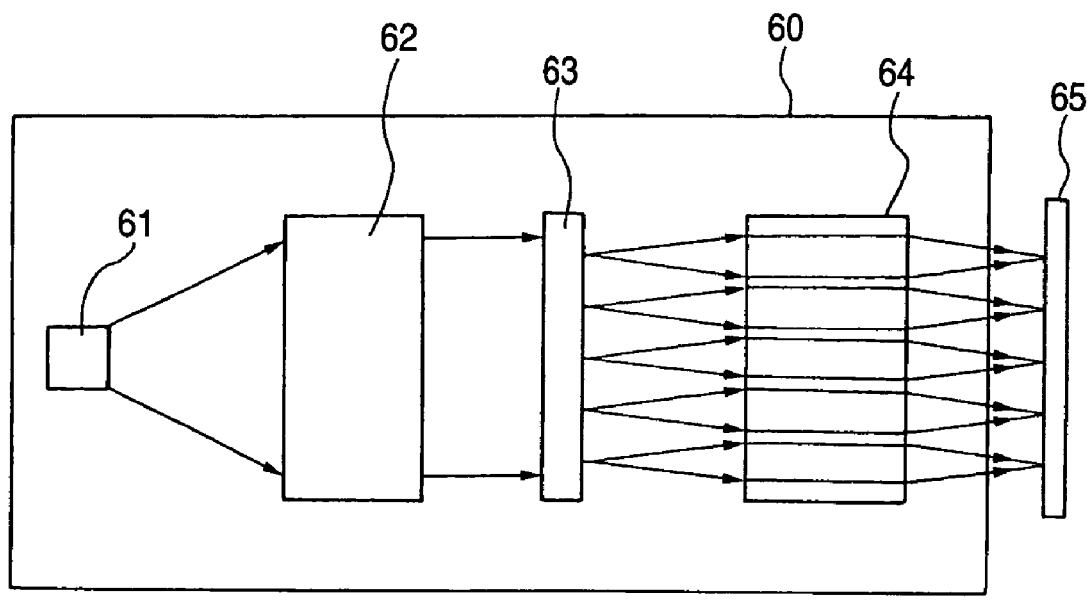
FIG. 13 is a drawing to show a schematic configuration of an exposure device to describe a sixth embodiment of the invention.

FIG. 13 is a drawing to show a schematic configuration of an exposure device to describe a sixth embodiment of the invention.

An exposure device 60 includes an illumination light source 61, an illumination optical system 62, a spatial light modulator array 63 having the spatial light modulators described in any of the first to fifth embodiments arranged in two dimensions on the same plane, and a projection optical system 64.

The illumination light source 61 is a light source such as a laser, a high-pressure mercury lamp, or a short arc lamp.

The illumination optical system 62 is a collimating lens (serving as a light collimating unit) for collimating plane light emitted from the illumination light source 61, for example. Collimated light passing through the collimating lens is vertically incident on the optical function films of the spatial light modulators of the spatial light modulator array 63.

Not only the collimating lens, but also a method of placing two microlenses in series, etc., is available as the means for collimating plane light emitted from the illumination light source 61. A light source having a small light emission point such as a short arc lamp is used as the illumination light source 61, whereby the illumination light source 61 may be assumed to be a point light source for making collimated light incident on the spatial light modulator array 63. An LED array having LEDs provided in a one-to-one correspondence with the spatial light modulators of the spatial light modulator array 63 may be used as the illumination light source 61 and light may be emitted with the LED array and the spatial light modulator array 63 brought close to each other for making collimated light incident on the spatial light modulators of the spatial light modulator array 63. To use a laser as the illumination light source 61, the illumination optical system 62 may be omitted.

The projection optical system 64 is provided for projecting light onto a sensitive material 65 of an image formation face; for example, it is a microlens array having microlenses provided in a one-to-one correspondence with the spatial light modulators of the spatial light modulator array 63 or the like, for example.

The operation of the exposure device 60 is as follows:

Plane light emitted from the illumination light source 61 is incident on the illumination optical system 62, and collimated light through the illumination optical system 62 is incident on the spatial light modulator array 63. The light incident on the optical function films of the spatial light modulators of the spatial light modulator array 63 has transmittance controlled in response to an image signal. The light emitted from the spatial light modulator array 63 is projected onto the image formation face of the sensitive material 65 by the projection optical system 64 for exposing the face to the light. The projection light is projected onto the sensitive material 65 while moving in the scanning direction relatively to the sensitive material 65, and a wide area can be exposed to the light at high resolution.

The collimating lens is thus provided on the light incidence face side of the spatial light modulator array 63, whereby the light incident on the planar substrates of the spatial light modulators can be collimated. The spatial light modulator of the embodiment reflects light when the optical function film is parallel with the planar substrate; the spatial light modulator allows light to pass through when the optical function film is inclined relative to the planar substrate. Thus, incident light is collimated and is always vertically incident on the planar substrate, so that highly accurate light modulation is made possible.

An array having the spatial light modulators described in any of the first to fifth embodiments arranged in one-dimension on the same plane may be used as the spatial light modulator array 63.

(Seventh Embodiment)

An exposure device to describe a seventh embodiment of the invention uses a microlens array rather than the collimating lens as the illumination optical system 62 of the exposure device 60 shown in FIG. 13. Microlenses of the microlens array are provided in a one-to-one correspondence with the spatial light modulators of a spatial light modulator array 63, and the optical axis and the focal plane of each microlens are designed and adjusted so as to match the center of the optical function film of the corresponding spatial light modulator.

Incident light from an illumination light source 61 is gathered in an area smaller than the area of the optical function film of the spatial light modulator through the microlens array and is incident on the spatial light modulator array 63. The light incident on the optical function film of each spatial light modulator of the spatial light modulator array 63 has transmittance controlled in response to an image signal. The light emitted from the spatial light modulator array 63 is projected onto the image formation face of a sensitive material 65 by a projection optical system 64 for exposing the face to the light. The projection light is projected onto the sensitive material 65 while moving in the scanning direction relatively to the sensitive material 65 for exposing the material to the light, and a wide area can be exposed to the light at high resolution.

Thus, the light from the illumination light source 61 can be gathered through the microlens array, so that an exposure device with the enhanced light use efficiency can be provided.

The lens form of each microlens is not limited, such as a spherical surface or a semi-spherical surface, and may be a convex curved surface or a concave curved surface. Further, the microlens array may be a flat microlens array having a diffractive index distribution or may be an array of Fresnel lenses, grating lenses of binary optics, etc.

The material of the microlens is transparent glass or resin, for example. The resin is excellent from the viewpoint of mass productivity, and the glass is excellent from the viewpoint of the life and the reliability. From the optical viewpoint, preferably silica glass, molten silica, alkalifree glass, etc., is adopted as the glass and preferably, acrylic resin, epoxy resin, polyester resin, polycarbonate resin styrenic resin, vinyl chloride resin, etc., is adopted as the resin. Photo-setting resin, thermoplastic resin, etc., is available as the resin and preferably, appropriate resin is selected in response to the manufacturing method of the microlens.

As the manufacturing method of the microlens, a cast molding method with mold, a press molding method, an injection molding method, a print method, a photolithography method, etc., is practical. Particularly, as a method capable of forming the microlenses finely with high accuracy and moreover providing good productivity, to form a microlens array of resin material, a molding method with photo (ultraviolet rays, etc.,)-setting resin or a photolithography method with positive or negative resist material is preferred; to form a glass-based microlens array, a resist transfer method of RIE (reactive ion etching), an isotropic etching method, or an ion exchange method is preferred.

To form a microlens array by the molding method, for example, thermoplastic resin is heated and pressed using a mold shaped like a microlens. To perform finer molding, preferably photo-setting resin or thermoplastic resin is filled into a mold and is pressed and then is hardened by light or heating and is peeled off from the mold. Accordingly, fine molding is made possible. Particularly, if fine and high accuracy is required, preferably photo-setting resin less expanded or shrunken by heating is used.

To form a microlens array made of resin by the photolithography method, for example, photo-melting resin or photo-setting resin typified by a transparent photoresist is exposed to ultraviolet rays (or visible light) appropriately through a patterned light shield mask, and melt developing of the exposure part or non-exposure part is performed. Accordingly, it is possible to provide a microlens of any desired shape with resin material and light exposure amount distribution. After the developing, high-temperature baking treatment or baking treatment can be performed for providing a microlens array of any desired shape by the surface tension at the heat softening time (reflow method) depending on the resin material.

To form a microlens array made of glass by the photolithography method, for example, a transparent substrate on which a spatial light modulator is provided for allowing incident light from a light source to pass through is etched. To etch the substrate, if an application film is applied as the shape corresponding to the microlens array, the microlens array is easily formed to any desired shape.

(Eighth Embodiment)

In an eighth embodiment of the invention, an image formation apparatus using a spatial light modulator array having the spatial light modulators described in the first to fifth embodiments arranged in two dimensions on the same plane will be discussed. A projector will be discussed as an example of the image formation apparatus.

Figure 14:
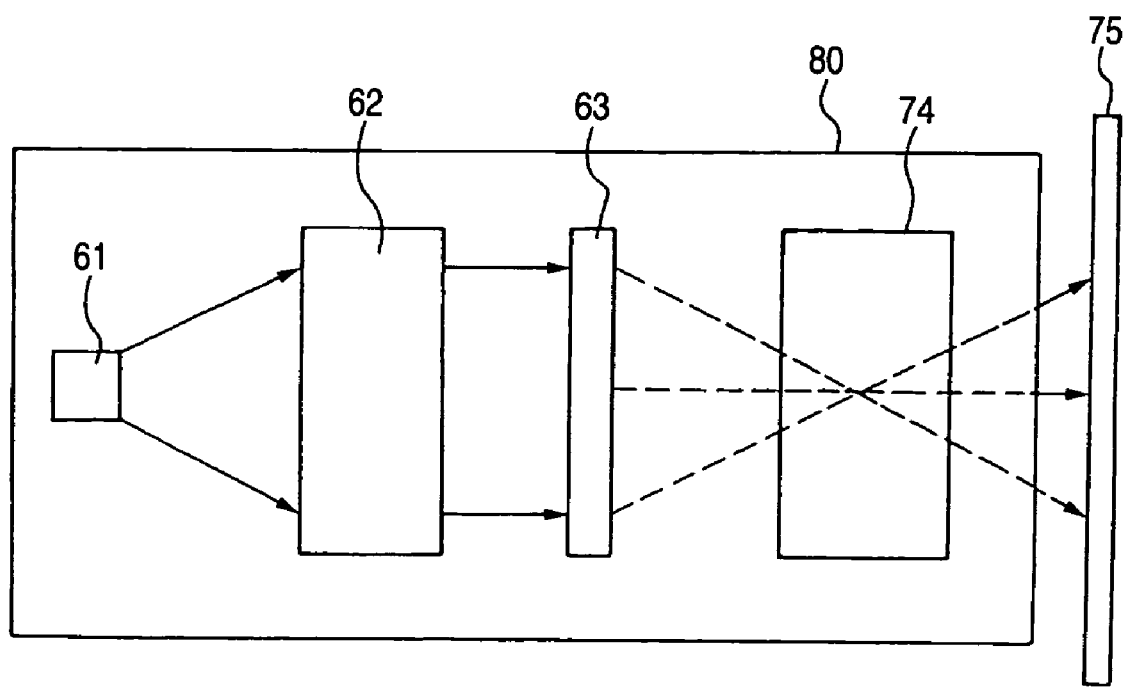
FIG. 14 is a drawing to show a schematic configuration of a projector to describe an eighth embodiment of the invention.

FIG. 14 is a drawing to show a schematic configuration of a projector to describe the eighth embodiment of the invention. Components similar to those previously described with reference to FIG. 13 are denoted by the same reference numerals in FIG. 14.

A projector 80 includes an illumination light source 61, an illumination optical system 62, a spatial light modulator array 63, and a projection optical system 74.

The projection optical system 74 is an optical system for a projector for projecting light onto a screen 75 of an image formation face.

The illumination optical system 62 may be a collimating lens described in the sixth embodiment or may be a microlens array described in the seventh embodiment.

The operation of the projector 80 is as follows:

Incident light emitted from the illumination light source 61 is gathered in an area smaller than the area of an optical function film of a spatial light modulator through a microlens array, for example, and is incident on the spatial light modulator array 63. The light incident on the optical function film of each spatial light modulator of the spatial light modulator array 63 has transmittance controlled in response to an image signal. The light emitted from the spatial light modulator array 63 is projected onto the image formation face of the screen 75 by the projection optical system 74 for exposing the face to the light.

Thus, the spatial light modulator array 63 can also be used for the projector.

In the sixth to eighth embodiments, the exposure device and the projector are taken as the image formation apparatus, but the spatial light modulator array can also be applied to a display.

According to the invention, there can be provided a miniaturizable transmission spatial light modulator for controlling the transmittance of light for performing light modulation.

The entire disclosure of each and every foreign patent application from which the benefit of foreign priority has been claimed in the present application is incorporated herein by reference, as if fully set forth.

What is claimed is:

1. A spatial light modulator for changing transmittance of incident light from a light source to perform light modulation, the spatial light modulator comprising:

a plane substrate transparent for the incident light;

a first electrode being provided on the plane substrate;

a deformable member being provided above the plane substrate and containing a second electrode placed with a gap above said first electrode, the deformable member deforming in response to an electrostatic force occurring as voltage is applied to said first electrode and the second electrode; and an optical function film being formed on the deformable member, wherein the optical function film has incidence angle dependency that the transmittance of the incident light changes in response to an incidence angle of the incident light on the optical function film, and is inclinable relative to the plane substrate in response to the electrostatic force.

2. The spatial light modulator according to claim 1, wherein the deformable member has a face parallel with the plane substrate in a state in which the electrostatic force does not occur, and the parallel face contains a slope inclined relative to the plane substrate in a state in which the electrostatic force occurs, and wherein the optical function film is formed on the slope.

3. The spatial light modulator according to claim 2, wherein the optical function film reflects the incident light in a state in which the optical function film is parallel with the plane substrate and allows the incident light to pass through in a state in which the optical function film is inclined relative to the plane substrate.

4. The spatial light modulator according to claim 2, wherein the optical function film is formed at a position on the slope not overlapping the first electrode.

5. The spatial light modulator according to claim 2, wherein the deformable member is a planar member, the spatial light modulator further comprising a hinge part that supports the deformable member rotatably in a direction in which the electrostatic force acts.

6. The spatial light modulator according to claim 2, wherein the deformable member is placed above the first electrode on the plane substrate.

7. The spatial light modulator according claim 1, further comprising a third electrode being opposed to the second electrode and above the second electrode.

8. The spatial light modulator according to claim 1, wherein the optical function film contains a dielectric multilayer.

9. The spatial light modulator according to claim 1, wherein the optical function film contains a film using a cholesteric liquid crystal layer.

10. A spatial light modulator array comprising a plurality of spatial light modulators in one dimension or in two dimensions on the same plane, each of said plurality of spatial light modulators being a spatial light modulator according to claim 1.

11. The spatial light modulator array according to claim 10, wherein the incident light is incident from below the plane substrate, the spatial light modulator array comprising a light collimating unit that collimates the incident light.

12. The spatial light modulator array according to claim 10, wherein the incident light is incident from below the plane substrate, and wherein the spatial light modulator array comprises, below the plane substrate, a microlens array having a plurality of microlenses, each of which corresponding to each of said plurality of spatial light modulators.

13. An image formation apparatus comprising:

a spatial light modulator array according to claim 10;

the light source; and a projection optical system that projects light emitted from the spatial light modulator array on an image formation face.

* * * * *